United States Patent
Kao et al.

(10) Patent No.: US 8,686,547 B1
(45) Date of Patent: Apr. 1, 2014

(54) STACK DIE STRUCTURE FOR STRESS REDUCTION AND FACILITATION OF ELECTROMAGNETIC SHIELDING

(75) Inventors: Huahung Kao, San Jose, CA (US); Thomas Ngo, San Jose, CA (US); Shiann-Ming Liou, Campbell, CA (US)

(73) Assignee: Marvell International Ltd., Hamilton (BM)

( * ) Notice: Subject to any disclaimer, the term of this patent is extended or adjusted under 35 U.S.C. 154(b) by 263 days.

(21) Appl. No.: 13/335,250

(22) Filed: Dec. 22, 2011

Related U.S. Application Data

(60) Provisional application No. 61/429,343, filed on Jan. 3, 2011.

(51) Int. Cl.
*H01L 23/495* (2006.01)
*H01L 23/49* (2006.01)

(52) U.S. Cl.
USPC ........... 257/676; 257/690; 257/723; 257/777; 257/E21.502; 257/E23.023; 257/E23.031; 257/E23.052; 438/109; 438/127

(58) Field of Classification Search
USPC .................. 257/676, 690, 723, 777, E21.502, 257/E23.023, E23.031, E23.052; 438/109, 438/127
See application file for complete search history.

(56) References Cited

U.S. PATENT DOCUMENTS

| | | | |
|---|---|---|---|
| 2007/0290332 A1* | 12/2007 | Chiu et al. | 257/723 |
| 2008/0073763 A1* | 3/2008 | Jungsuwadee | 257/676 |
| 2008/0128900 A1* | 6/2008 | Leow et al. | 257/723 |

\* cited by examiner

*Primary Examiner* — Dao H Nguyen

(57) ABSTRACT

Embodiments of the present disclosure describe a packaged semiconductor device that reduces stress on a semiconductor device caused by thermal expansion of the insulating material used in the packaged semiconductor device. In one embodiment, an inactive semiconductor device is coupled to the top of active semiconductor device. Both the inactive and active devices are encapsulated by the insulating material. The configuration of the inactive device is selected based on its ability to absorb the expansion of the insulating material at operating temperature.

20 Claims, 4 Drawing Sheets

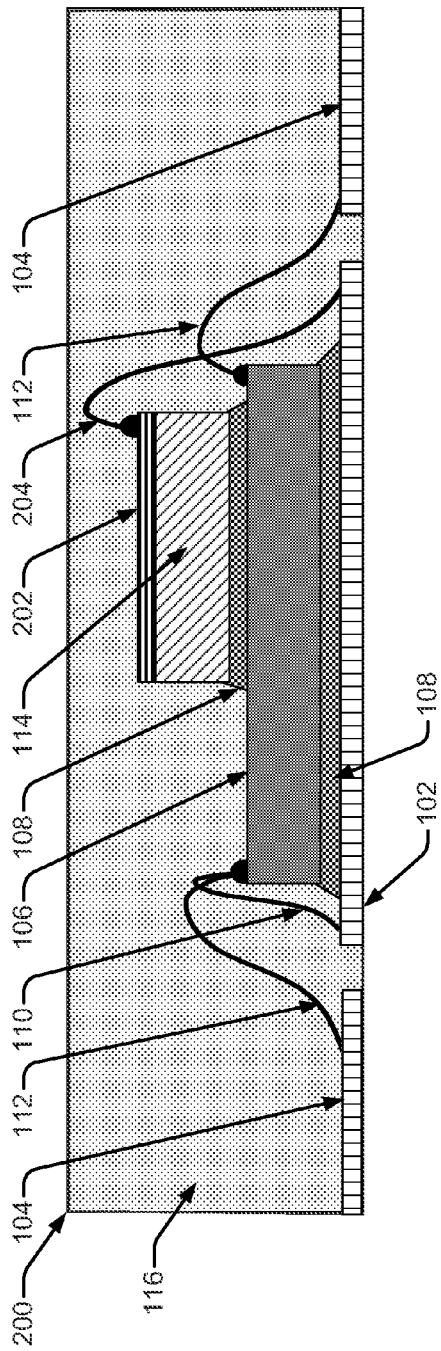
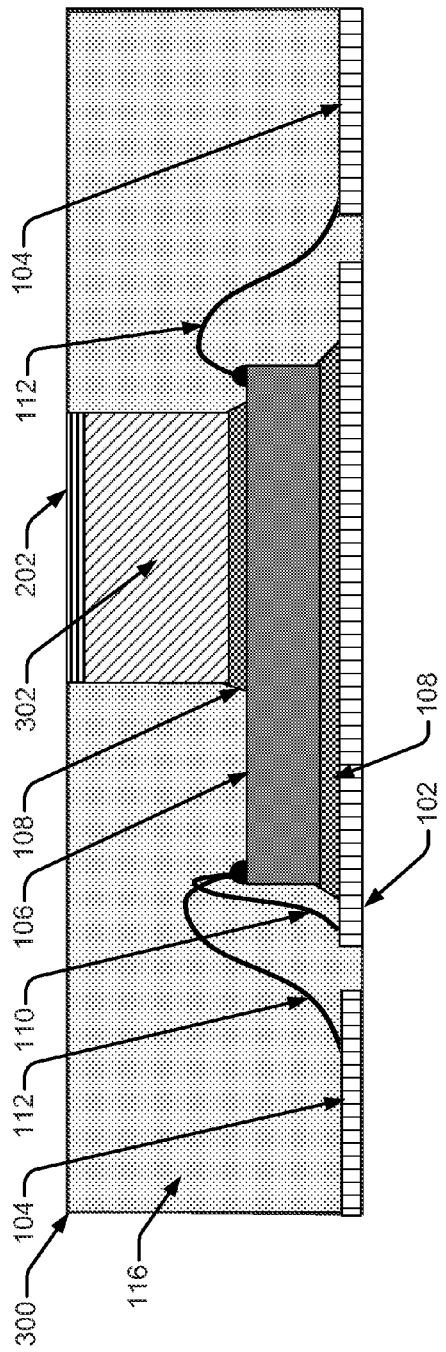

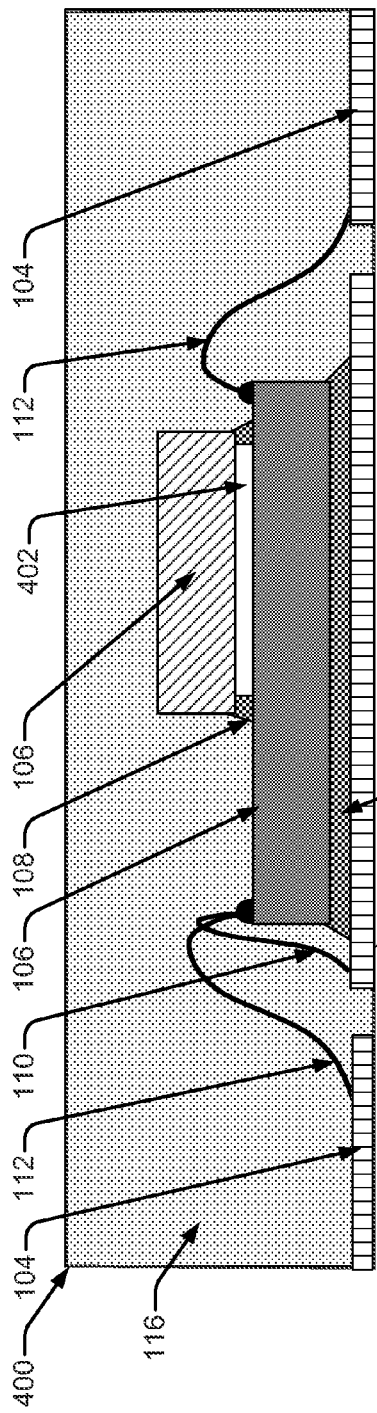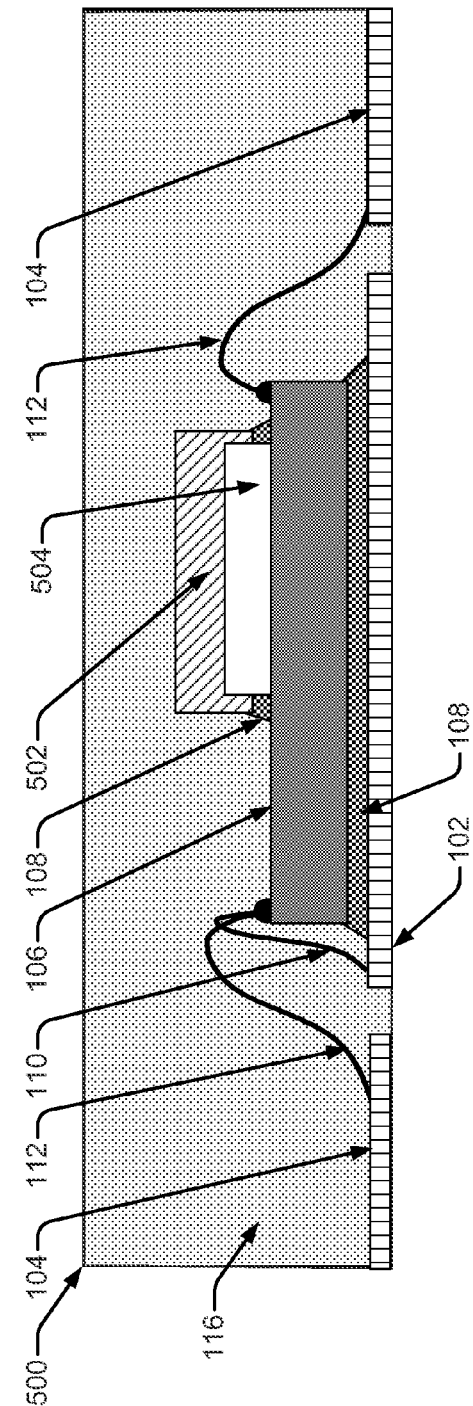

STACK DIE STRUCTURE FOR STRESS REDUCTION AND FACILITATION OF ELECTROMAGNETIC SHIELDING

CROSS REFERENCE TO RELATED APPLICATIONS

This disclosure claims priority to U.S. Provisional Patent Application No. 61/429,343, filed Jan. 3, 2011, the entire specification of which is hereby incorporated by reference in its entirety for all purposes, except for those sections, if any, that are inconsistent with this specification.

TECHNICAL FIELD

Embodiments of the present disclosure relate to the field of integrated circuits, and more particularly, to techniques, structures, and configurations of semiconductor chip packaging.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Thermal characteristics of packaged semiconductor devices can have a significant impact on the performance and reliability of the semiconductor devices. Thermal variations during normal operations of a semiconductor device can cause stress failures in the semiconductor device and the materials used to package the semiconductor device. As the temperature of the semiconductor device varies, the various materials used to package the semiconductor device can expand and contract at different rates. Over time, stress or fatigue due to the expansion and contraction of the various materials can result in structural damage to the semiconductor device which may prevent the semiconductor device from functioning as intended.

SUMMARY

This disclosure relates to a device and method for reducing thermal stress on a packaged semiconductor device caused by the thermal expansion of the insulating material used to encapsulate the semiconductor device. The device includes a lead frame, a first semiconductor device, a second semiconductor device coupled to the top of the first semiconductor device, and insulating material encapsulating the first and second semiconductor devices. The second semiconductor component is not electrically active and does not electrically interact with the first semiconductor component or any other electrical component outside of the device.

In one embodiment, the first semiconductor component has a first coefficient of thermal expansion, the insulating material has a second coefficient of thermal expansion, and the second semiconductor has a third coefficient of thermal expansion. The first and second coefficients of the thermal expansion are substantially different from each other. For example, the second coefficient of thermal expansion is at least 20% higher than the first coefficient of thermal expansion. In one embodiment, the third coefficient of thermal expansion is greater than or equal to the second coefficient of thermal expansion but less than the second coefficient of thermal expansion. In another embodiment, the second semiconductor is configured to adsorb the thermal expansion of the insulating material thereby minimizing the stress applied to the first semiconductor device by the expanding insulating material.

In another embodiment, the device is manufactured by coupling the first semiconductor device to a die pad and coupling the second semiconductor device to the top of first semiconductor device. The insulating material is formed around the first and second device to provide insulating and physical protection.

This Brief Summary is provided to introduce simplified concepts relating to techniques for embedding a metal layer into a molded package for semiconductor devices, which are further described below in the Detailed Description. This Summary is not intended to identify essential features of the claimed subject matter, nor is it intended for use in determining the scope of the claimed subject matter.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

FIG. 2 illustrates a side view of an embodiment of a packaged semiconductor device.

FIG. 3 illustrates a side view of an embodiment of a packaged semiconductor device.

FIG. 4 illustrates a cross sectional view of an embodiment of a packaged semiconductor device.

FIG. 5 illustrates a cross sectional view of an embodiment of a packaged semiconductor device.

DETAILED DESCRIPTION

Figure 1:
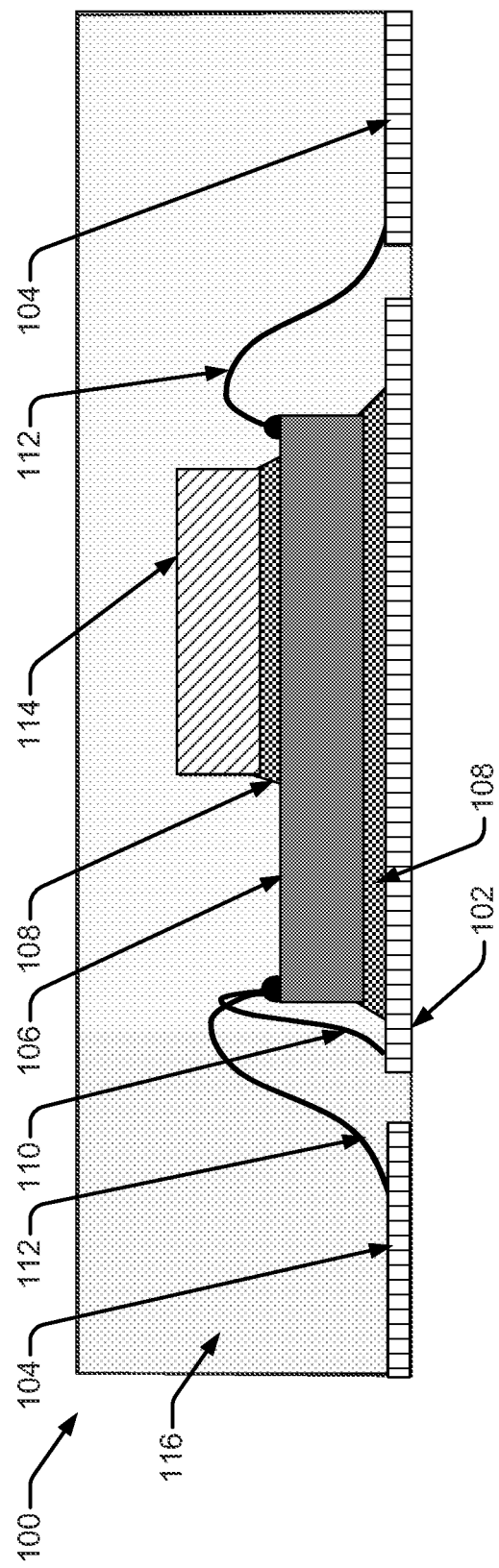
FIG. 1 illustrates a side view of an embodiment of a packaged semiconductor device.

FIG. 1 illustrates a side view of a packaged wire bonded device (device) 100 in a Quad Flat no lead (QFN) package configuration. However, the QFN configuration is used for purposes of illustration only and not limitation. The techniques to reduce and isolate stress and electromagnetic interference described herein may be used in any type of semiconductor packaging device. For example, the techniques may be used with, but are not limited to, Quad Flat Packages (QFP), Ball Grid Array (BGA), Thin & Fine Pitch BGA (TFBGA), molded Flip-Chip Chip Scale Package (FCCSP), and Multi-Row QFN (MRQFN).

The packaged wire bonded device 100 of FIG. 1 includes a lead frame comprised of a die pad 102 and a plurality of leads 104. The die pad 102 supports the semiconductor component 106, and is secured or coupled to the die pad 102 by adhesive material 108. In one embodiment, the semiconductor component 106 is a semiconductor device having one or more electrical circuit to perform one or more corresponding functions. As noted above, the leads 104 are shown in QFN configuration. Only two of the leads are shown for clarity and simplicity. However, the QFN configuration generally includes several more leads that surround the semiconductor component 106. The packaged wire bonded device 100 also comprises a grounding wire 110 coupled to i) the semiconductor component 106 and ii) the die pad 102. In this embodiment, the die pad 102 also functions as electrical ground. Further, the plurality of leads 104 are individually coupled to the semiconductor component 106 by respective wires 112.

In one embodiment, a second semiconductor component 114 is coupled to the top surface of the semiconductor component 106 via an adhesive material 108. A molding compound 116 is deposited or formed to encapsulate, protect, and secure the components of the packaged wire bonded device 100, such that the packaged wire bonded device 100 can be handled or exposed to environmental conditions that could otherwise damage the semiconductor component 106.

In one embodiment, the second semiconductor component 114 comprises an inactive or non-functional semiconductor component. In this embodiment, the inactive semiconductor component does not function or operate electrically by itself or in conjunction with the semiconductor component 106. In one embodiment, the second semiconductor component 114 is electrically passive to operations performed by the semiconductor component 106.

In another embodiment, the second semiconductor component 114 may be a piece of silicon or other silicate material that simply acts as a spacer between the semiconductor component 106 and the molding compound 116. For example, the spacer material may include, but is not limited to, Tetraethyl Orthosilicate (TEOS), Boronphosphosilicate glass (BPSG) or Phosphossilicte glass (PSG). In another embodiment, the second semiconductor component 114 comprises a gel, such as gel that can adsorb the thermal expansion of the first semiconductor device and the second semiconductor device. For instance, the gel is compressible when external forces are applied such that the gel maintains structural cohesion. In another embodiment, the second semiconductor component 114 comprises a ceramic, such as silicon carbide. In each of these embodiments, the second semiconductor component 114 is electrically passive to operations performed by the semiconductor component 106. In another embodiment, the second semiconductor component 114 can include circuits to perform one or more functions, in conjunction with or separate from, the functions associated with the semiconductor component 106.

During general operations of the semiconductor component 106, the temperature of the packaged wire bonded device 100 can exceed several hundred degrees. Over time, the temperature can transition to ambient temperature conditions when the packaged wire bonded device 100 is not being used or in a low power state. Accordingly, materials that form the packaged wire bonded device 100 will expand and contract with changes in temperature. The materials that form the lead frame, semiconductor component 106, molding material 116, and the wire bonds 110/112 can each have unique material properties that expand and contract at different rates. The rate at which materials can expand or contract can be indicated by a coefficient of thermal expansion (CTE), which is a measure of the amount of change in volume in response to a change in temperature. For example, the CTE of the molding compound 116 may be between 10-15 and the CTE of the semiconductor component 106 may be between 2.5-3. The CTE of the second semiconductor component 114 is material dependent. The material for the second semiconductor component 114 is chosen based on the amount and location of the stresses within the packaged wire bonded device 100. In one embodiment, the CTE of the first semiconductor component 106 is substantially similar to the CTE of the second semiconductor component 114 (e.g., within 20%). In another embodiment, the CTE if the insulating material 116 is substantially different from the CTE of the first semiconductor component 106 (e.g., greater than 20%).

During expansion or contraction, stress typically concentrates at the corners or edges of the materials and at the interfaces between materials that have dissimilar CTEs.

In one embodiment, the material for the second semiconductor component 114 is selected based on its ability to minimize or absorb the contraction and/or expansion of the molding compound 116 and/or the semiconductor component 106. For example, if one places two materials having differing CTES in contact with each other and subject the two materials to temperature fluctuations, the amount of expansion or contraction will generally be imparted to the interface between the two materials. Accordingly, the material at the interface will expand or contract at a higher rate than it normally would by itself. As a result, the material will be subject to higher amounts of stress that could lead to fatigue or stress fractures at a higher rate than if the material was not coupled to another material having a differing CTE. One approach to minimize stress is to insert a third material between two materials having a differing CTE, so that the third material can minimize or absorb the expansion/contraction of the two materials. In another approach, a sacrificial material, such as an inactive device, can be inserted between the two materials. This approach can allow the sacrificial material to incur the additional stress. In FIG. 1, the second semiconductor component 114 is representative of the third material or the sacrificial material discussed above.

The relative heights of the semiconductor component 106 and the second semiconductor component 114 can also have an impact on the amount of stress reduction for the device 100. In one embodiment, the heights of the semiconductor component 106 and the second semiconductor component 114 are the same. For example, each of the components 106/114 may be 5 mm high. Alternatively, the height of each semiconductor component 106/114 are the same or are different from each other.

FIG. 2 is a side view of a packaged wire bonded device 200 in a Quad Flat no lead (QFN) package configuration, and illustrates an embodiment that reduces stress and protects the packaged wire bonded device 200 from electromagnetic interference (EMI). In this embodiment, a metal layer 202 is placed on the top of the second semiconductor component 114. The metal layer 202 may be comprised of aluminum or copper. The metal layer 202 can act as a shield for any EMI that is exposed to the packaged wire bonded device 200. For example, the metal layer 202 can shield a complementary metal oxide semiconductor (CMOS) oscillator (not shown) that is within the semiconductor component 106. The oscillator may be used as a clock for the semiconductor component 106. EMI can shift the operational frequency of the oscillator and make the oscillator ineffective as a clock in managing the operations of the semiconductor component 106. A grounding wire 204 may also connect the metal layer 202 with the die pad 102. The grounding wire acts as an electrical ground to dissipate electrical charge that is present on the metal layer 202.

In an alternative embodiment, the packaged wire bonded device 200 does not include a grounding wire (e.g., wire 204) to connect the metal layer 202 to the die pad 102.

FIG. 3 is a side view of a packaged wire bonded device 300 in a Quad Flat no lead (QFN) package configuration, and illustrates an embodiment that reduces stress, protects the device from EMI, and increases heat transfer away from the semiconductor component 106. In this embodiment, a second semiconductor component 302 extends from the top of the semiconductor component 106 to the top surface of the molding compound 116. In one embodiment, the second semiconductor component 302 is a spacer. In addition to providing a stress reduction capability, the second semiconductor component 302 also acts as a heat sink that transfers heat generated by the semiconductor component 106 to the ambient environment surrounding the packaged wire bonded device 300. This embodiment also includes the metal layer 202 described above; however, the metal layer 202 may not be present in an alternative embodiment.

FIGS. 4 and 5 illustrate cross sectional side views of embodiments that reduce stress and increase isolation between the second semiconductor component 114 and the semiconductor component 106.

FIG. 4 is a cross sectional side view of a packaged wire bonded device 400 in a Quad Flat no lead (QFN) package configuration. In this embodiment, an air gap 402 is located between the second semiconductor component 114 and the semiconductor component 106. The air gap 402 provides additional electrical isolation for the semiconductor component 106. In an alternative embodiment, the air gap 402 may be replaced with a vacuum gap to provide greater dielectric strength or electrical isolation.

FIG. 5 is a cross sectional side view of a packaged wire bonded device 500 in a Quad Flat no lead (QFN) package configuration. In this embodiment, the second semiconductor component 502 is modified to increase the size of the air gap 504 in comparison to the air gap 402 described in FIG. 4. The increased size provides even greater electrical isolation.

Figure 6:
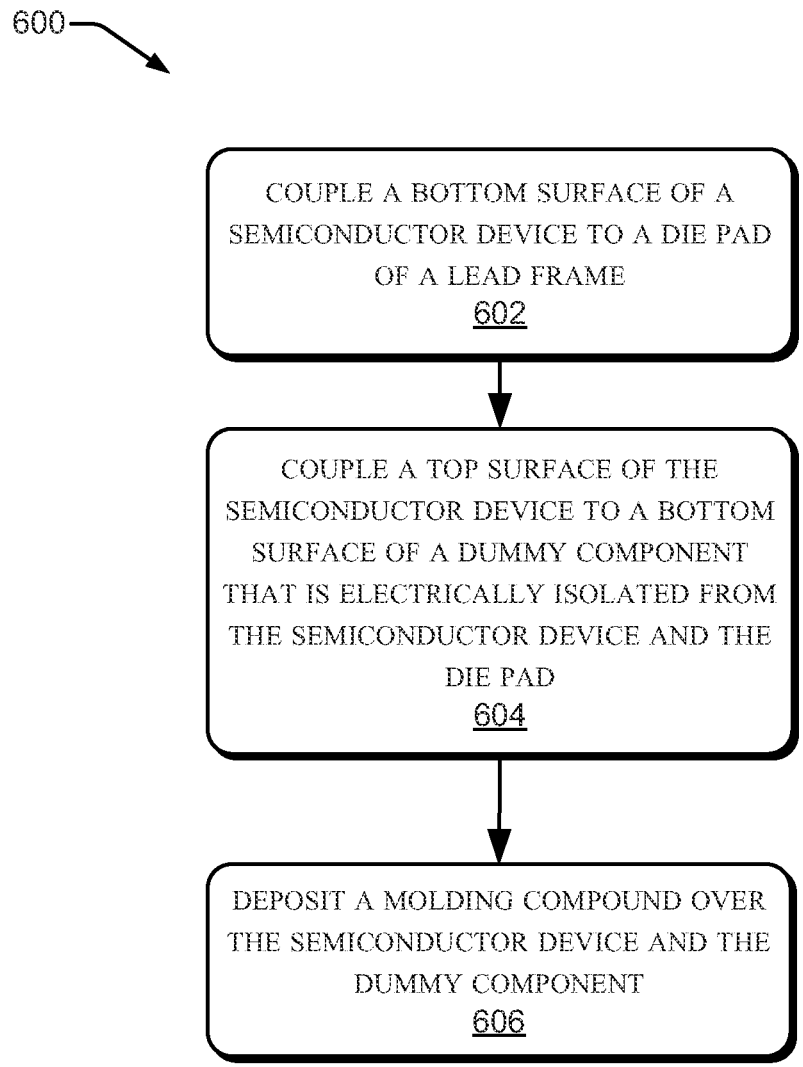
FIG. 6 illustrates a process flow diagram including steps to manufacture a packaged semiconductor device.

FIG. 6 is a process flow diagram 600 that describes steps for manufacturing the packaged wire bonded devices described above in FIGS. 1-3.

At 602, a lead frame comprising a die pad (e.g., die pad 102) and a plurality of leads (e.g., leads 104) are provided as the foundation for a packaged wire bonded device (e.g., packaged wire bonded device 100). The die pad functions as the primary support for a semiconductor component (e.g., semiconductor component 106) and as the electrical ground for the semiconductor component. The leads 104 are the primary input/output conduits for the semiconductor component. Incoming signals and/or outgoing signals are provided to and from the semiconductor component via the leads. The bottom surface of the semiconductor component is secured to the die pad using an adhesive material (e.g., adhesive material 108) or any other coupling means that prevents the semiconductor component from moving from the die pad.

At 604, a second semiconductor component (e.g., second semiconductor component 114) is secured to the top surface of the semiconductor component using an adhesive material (e.g., adhesive material 108). The second semiconductor component may be located offset from the center of the semiconductor component, such as being closer to the edge of the semiconductor component where the impact of thermal related stress will be higher. In another embodiment, the second semiconductor component may be centered on top of the semiconductor device (not shown). In yet another embodiment, more than one second semiconductor component may be coupled to the top surface of the semiconductor component (not shown). For example, two second semiconductor components may be placed equal distance apart in a symmetrical manner with respect to a semiconductor component. Alternatively, four second semiconductor components may be arranged near each corner of a four sided semiconductor component (not shown). Various other arrangements of second semiconductor components are feasible that reduce the amount of stress placed on a semiconductor component and/or molding compound.

After the semiconductor component is secured to the die pad, a wire bonding process is used to wire electrical connections from the semiconductor component to i) the die pad and ii) the leads. For example, a grounding wire (e.g., grounding wire 110) completes the grounding circuit and wires (e.g., wires 112) are each coupled to individual leads to complete the input/output circuits for the semiconductor component.

In an alternative embodiment, a metal layer (e.g., metal layer 202) is deposited on top of the second semiconductor component to act as an EMI shield. In a variation of this embodiment, a grounding wire (e.g., grounding wire 204) connects the metal layer with electrical ground via the die pad.

At 604, a molding compound (e.g., molding compound 116) is deposited or formed over the top of the semiconductor component and the second semiconductor component. In one embodiment, the molding compound provides a protective layer that insulates the semiconductor component from unintended electrical charges and prevents the semiconductor component from being damaged during handling or installation of the packaged wire bonded device on, for example, a printed circuit board (not shown).

The descriptions above may use perspective-based descriptions such as up/down, over/under, and/or top/bottom. Such descriptions are merely used to facilitate the discussion and are not intended to restrict the application of embodiments described herein to any particular orientation.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

The terms chip, integrated circuit, monolithic device, semiconductor device, die, and microelectronic device are often used interchangeably in the microelectronics field. The present invention is applicable to all of the above as they are generally understood in the field.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A device comprising:
   a lead frame including a die pad;
   a first semiconductor component including (i) a top surface and (ii) a bottom surface, wherein the bottom surface of the first semiconductor component is coupled to the die pad, and wherein the first semiconductor component has a first coefficient of thermal expansion;

a second semiconductor component coupled to the top surface of the first semiconductor component, the second semiconductor component being electrically isolated from (i) the first semiconductor component and (ii) the die pad; and an insulating material covering each of (i) the first semiconductor component and (ii) the second semiconductor component, the insulating material having a second coefficient of thermal expansion that substantially differs from the first coefficient of thermal expansion, wherein the second semiconductor component has a third coefficient of thermal expansion that is less than the second coefficient of thermal expansion and is greater than or equal to the first coefficient of thermal expansion.

2. The device of claim 1, wherein:
the second semiconductor component comprises (i) a top surface and (ii) a bottom surface;
the bottom surface of the second semiconductor component is coupled to the top surface of the first semiconductor component; and
the device further comprises a metal layer coupled to the top surface of the second semiconductor component.

3. The device of claim 2, wherein:
the die pad comprises an electrical ground; and
the device further comprises a grounding wire coupled to the metal layer, wherein (i) a first end of the grounding wire is coupled to the metal layer, and (ii) a second end of the grounding wire is the electrical ground.

4. The device of claim 2, wherein the first semiconductor component further comprises a complementary metal oxide silicon (CMOS) oscillator that is subjacent to each of the second semiconductor component and the metal layer.

5. The device of claim 1, wherein the second semiconductor component comprises an inactive device.

6. The device of claim 5, wherein:
the coefficient of thermal expansion of the first semiconductor component is less than three;
the coefficient of thermal expansion of the second semiconductor component is less than five; and
the coefficient of thermal expansion of the insulating material is between ten and fifteen.

7. The device of claim 1, wherein the second semiconductor component is electrically isolated from the first semiconductor component based in part on an air gap located between the second semiconductor component and the first semiconductor component.

8. The device of claim 1, wherein the lead frame further comprises a plurality of leads, and the device further comprises:
a plurality of lead wires, each of the plurality of lead wires comprising (i) a first end coupled to the first semiconductor component, and (ii) a second end coupled to a corresponding lead of the plurality of leads; and
a grounding wire comprising (i) a first end coupled to the first semiconductor component and (i) a second end coupled to the die pad.

9. The device of claim 1, wherein the second semiconductor component comprises a spacer.

10. The device of claim 9, wherein the spacer comprises a gel or a ceramic material.

11. The device of claim 9, wherein the second semiconductor component is further configured to reduce stress caused by the substantial difference between the first coefficient of thermal expansion of the first semiconductor component and the second coefficient of thermal expansion of the insulating material.

12. The device of claim 9, wherein the spacer comprises silicate glass comprising Tetraethyl Orthosilicate (TEOS), Boronphosphosilicate glass (BPSG) or Phosphossilicte glass (PSG).

13. The device of claim 1, wherein the insulating material comprises a molding compound.

14. A method comprising:
coupling a bottom surface of a first semiconductor component to a die pad of a lead frame, the first semiconductor component having a first coefficient of thermal expansion;
coupling a top surface of the first semiconductor component to a bottom surface of a second semiconductor component, the second semiconductor component being electrically isolated from each of (i) the first semiconductor component and (ii) the die pad; and
depositing an insulating material over (i) the first semiconductor component and (ii) the second semiconductor component, the insulating material having a second coefficient of thermal expansion that substantially differs from the first coefficient of thermal expansion,
wherein the second semiconductor component has a third coefficient of thermal expansion that is less than the second coefficient of thermal expansion and is greater than or equal to the first coefficient of thermal expansion.

15. The method of claim 14, wherein coupling the top surface of the first semiconductor component to the bottom surface of the second semiconductor component comprises creating an air gap between the first semiconductor component and the second semiconductor component.

16. The method of claim 14, further comprising:
prior to depositing the insulating material over (i) the first semiconductor component and (ii) the second semiconductor component, placing a metal layer on a top surface of the second semiconductor component.

17. The method of claim 16, further comprising:
prior to depositing the insulating material over (i) the first semiconductor component and (ii) the second semiconductor component, coupling a wire between the metal layer and the die pad.

18. The method of claim 14, wherein the first semiconductor component comprises a complementary metal oxide semiconductor oscillator.

19. The method of claim 14, wherein the second semiconductor component is further configured to reduce stress caused by the substantial difference between the first coefficient of thermal expansion of the first semiconductor component and the second coefficient of thermal expansion of the insulating material.

20. A device comprising:
a lead frame including a die pad;
a first semiconductor component including (i) a top surface and (ii) a bottom surface, wherein the bottom surface of the first semiconductor component is coupled to the die pad, and wherein the first semiconductor component has a first coefficient of thermal expansion;
a second semiconductor component coupled to the top surface of the first semiconductor component, the second semiconductor component being electrically inactive; and
an insulating material covering each of (i) the first semiconductor component and (ii) the second semiconductor component, the insulating material having a second coefficient of thermal expansion that substantially differs from the first coefficient of thermal expansion,
wherein the second semiconductor component is configured to adsorb the thermal expansion of the insulating material.

* * * * *